(12) United States Patent
Wang

(10) Patent No.: US 7,776,636 B2
(45) Date of Patent: Aug. 17, 2010

(54) METHOD FOR SIGNIFICANT REDUCTION OF DISLOCATIONS FOR A VERY HIGH Al COMPOSITION AlGAN LAYER

(75) Inventor: Tao Wang, Sheffield (GB)

(73) Assignee: CAO Group, Inc., West Jordan, UT (US)

( * ) Notice: Subject to any disclaimer, the term of this patent is extended or adjusted under 35 U.S.C. 154(b) by 48 days.

(21) Appl. No.: 11/411,191

(22) Filed: Apr. 25, 2006

(65) Prior Publication Data

US 2006/0264009 A1    Nov. 23, 2006

Related U.S. Application Data

(60) Provisional application No. 60/674,596, filed on Apr. 25, 2005.

(51) Int. Cl.
*H01L 21/00* (2006.01)
(52) U.S. Cl. .............. 438/46; 438/47; 438/22; 438/36; 438/93; 438/481; 257/E21.108; 257/E31.022; 257/E31.061; 257/E31.065; 257/E31.124
(58) Field of Classification Search .......... 438/478, 438/22, 24, 36, 37, 46, 47, 93, 481, 493; 257/E21.108, E31.019, 21, 22, 61, 65, 124, 257/E33.005; 256/E33.028, E33.033, E33.034
See application file for complete search history.

(56) References Cited

U.S. PATENT DOCUMENTS

| | | | | |
|---|---|---|---|---|
| 4,614,961 A * | 9/1986 | Khan et al. | ............... | 257/453 |
| 5,182,670 A * | 1/1993 | Khan et al. | ............... | 359/359 |
| 5,278,435 A * | 1/1994 | Van Hove et al. | ......... | 257/184 |
| 5,321,713 A * | 6/1994 | Khan et al. | ............. | 372/45.01 |
| 5,656,832 A * | 8/1997 | Ohba et al. | ............... | 257/190 |
| 5,900,647 A * | 5/1999 | Inoguchi | ................... | 257/76 |
| 6,177,292 B1 * | 1/2001 | Hong et al. | ................. | 438/46 |
| 6,328,796 B1 * | 12/2001 | Kub et al. | ................... | 117/94 |
| 6,391,748 B1 * | 5/2002 | Temkin et al. | ............ | 438/478 |
| 6,483,130 B1 * | 11/2002 | Yang et al. | ................ | 257/189 |
| 6,962,828 B1 * | 11/2005 | Koide et al. | ................. | 438/22 |
| 6,967,981 B2 * | 11/2005 | Chua et al. | ............. | 372/46.01 |
| 7,498,645 B2 * | 3/2009 | Li et al. | ..................... | 257/431 |
| 2001/0013605 A1 * | 8/2001 | Umezaki et al. | ............ | 257/13 |
| 2007/0066020 A1 * | 3/2007 | Beach | ...................... | 438/285 |

* cited by examiner

*Primary Examiner*—Michael S Lebentritt
(74) *Attorney, Agent, or Firm*—Geoffrey E. Dobbin

(57) ABSTRACT

A method for reducing dislocation density between an AlGaN layer and a sapphire substrate involving the step of forming a self-organizing porous AlN layer of non-coalescing column-like islands with flat tops on the substrate.

8 Claims, 2 Drawing Sheets
(2 of 2 Drawing Sheet(s) Filed in Color)

(b)

METHOD FOR SIGNIFICANT REDUCTION OF DISLOCATIONS FOR A VERY HIGH Al COMPOSITION AlGAN LAYER

CLAIM FOR PRIORITY

Priority is hereby claimed to U.S. Provisional Patent Application Ser. No. 60/674,596 filed on Apr. 25, 2005.

BACKGROUND

There is a need for techniques which permit semiconductor growth while reducing dislocation density. For additional background, the reader is directed to the following references:

1. Y Bilenko, A Lunev, X Hu, J Deng, T M Katona, J Zhang, R Gaska, M S Shur, W Sun, V Adivarahan, M Shatalov and A Khan, *Jpn. J. Appl. Phys.*, Part 2 44, L98 (2005).
2. J P Zhang, X Hu, Y Bilenko, J Deng, A Lunev, R Gaska, M Shatalov, J Yang and M A Khan, *Appl. Phys. Lett.* 85 55 (2004)
3. A Usui, H Sunakawa, A Sakai and A A Yamaguchi, *Jpn. J. Appl. Phys.*, Part 2 36, L899 (1997).
4. A. Sakai, H. Sunakawa, and A. Usui, *Appl. Phys. Lett.* 73, 481 (1998).
5. T. S. Zheleva, O. H. Nam, M. D. Bremser, and R. F. Davis, *Appl. Phys. Lett.* 71, 2472 (1997).
6. C. I. H. Ashby, C. C. Willan, H. Jung, N. A. Missert, P. P. Provencio, D. M. Follstaedt, G. M. Peake, and L. Griego, *Appl. Phys. Lett.* 77, 3233 (2000).
7. T. M. Katona, M. D. Craven, P. T. Fini, J. S. Speck, and S. P. DenBaars, *Appl. Phys. Lett.* 79, 2907 (2001).
8. K. Hiramatsu, K. Nishiyama, M. Onishi, H. Mizutani, M. Narukawa, A. Motogaito, H. Miyake, Y. Iyechika, and T. Maeda, *J. Cryst. Growth* 221, 316 (2000).
9. T. Wang, Y. Morishima, N. Naoi and S. Sakai, *J. Cryst. Growth* 213 188 (2000)
10. O. H. Nam, M. D. Bremser, B. L. Ward, R. J. Nemanich, and R. F. Davis, *Jpn. J. Appl. Phys.*, Part 2 36, L532 (1997).
11. R. S. Qhalid Fareed, V. Adivarahan, C. Q. Chen, S. Rai, E. Kuokstis, J. W. Yang, and M. Asif Khan, J. Caissie and R. J. Molnar, *Appl. Phys. Lett.* 84, 696 (2004)
12. K. Hirosawa, K. Hiramatsu, N. Sawaki, and 1. Akasaki, *Jpn. J. Appl. Phys.*, Part 2 32, L1039 (1993).
13. J. Li, K. B. Nam, M. L. Nakarmi, J. Y. Lin, H. X. Jiang, P Carrier and S H Wei, *Appl. Phys. Lett.* 83, 5163 (2003)
14. X. Tang, F. Hossain, K. Wongchotigul, and M. G. Spencer, *Appl. Phys. Lett.* 72, 1501 (2003)
15. T. Wang, J. Bai, P. J. Parbrook and A. G. Cullis, to be submitted
16. T. M. Katona, P. Cantu, S. Keller, Y. Wu, J. S. Speck, and S. P. DenBaars, *Appl. Phys. Lett.* 84, 5025 (2004).
17. S Heikman, S Keller, S Newman, Y Wu, C Moe, B Moran, M Schmidt, U. K. Mishra, J. S. Speck and S. P. DenBaars, *Jpn. J. Appl. Phys.*, Part 2 44, LA05 (2005).
18. H. Amano, N. Saaki, I. Akasaki, and Y. Toyoda, *Appl. Phys. Lett.* 48, 353 (1986).
19. J. Bai, T. Wang, P. J. Parbrook and A. G. Cullis, *J. Cryst. Growth*
20. A Hanlon, P. M Pattison, J F. Kaeding, R Sharma, P Fini and S Nakamura, *Jpn. J. Appl. Phys.*, Part 2 42, L628 (2003).
21. T. Shibata, K. Asai, S. Sumiya, M. Mouri, M. Tanaka, O. Oda, H. Katsukawa, H. Miyake and K. Hiramatsu, *Phys. Stat. Sol.* (C) 0, 2023 (2003)
22. Q. Paduano and D. Weyburne, *Jpn. J. Appl. Phys.* 42, 1590 (2003).

BRIEF DESCRIPTION OF DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
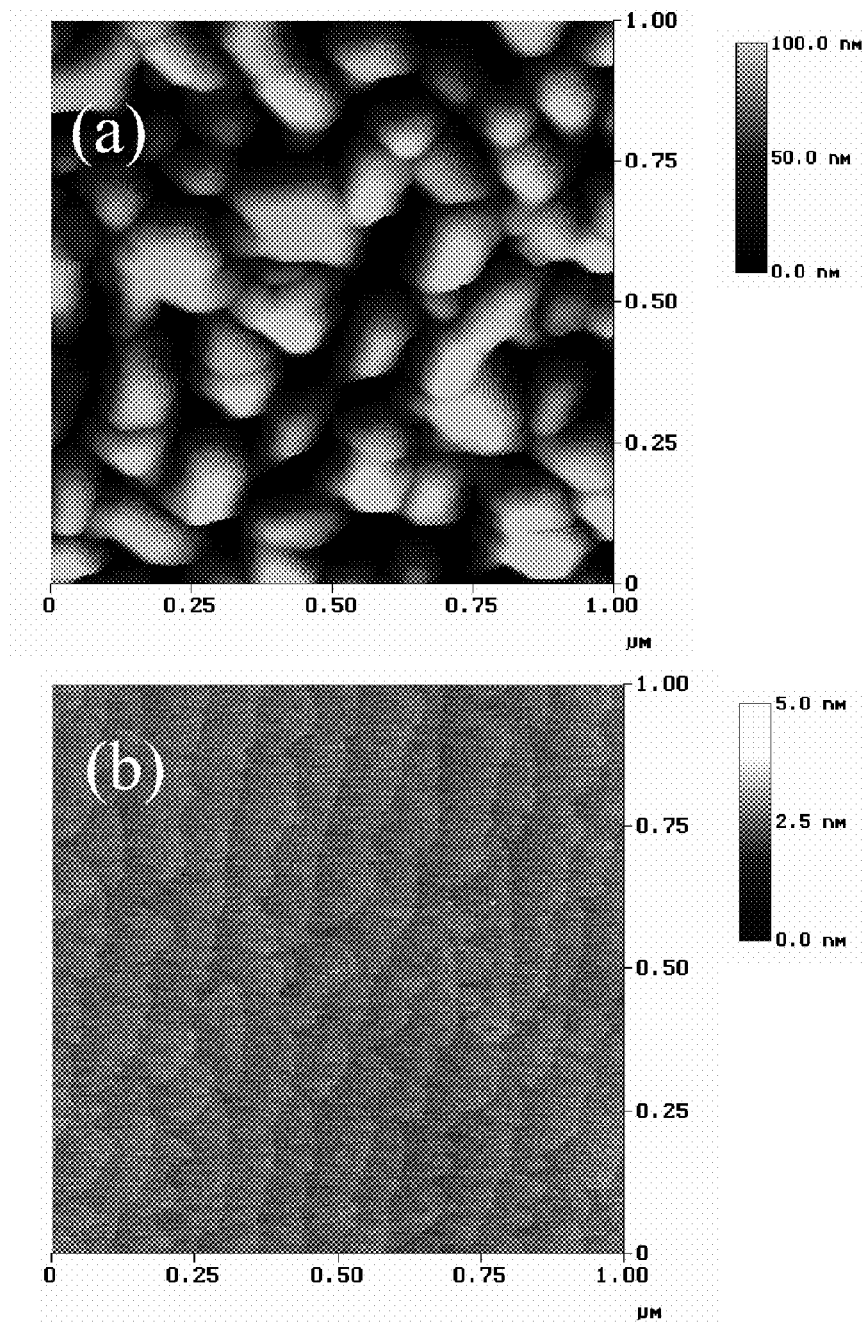
FIG. 1 depicts AFM images of (a) an AlN layer with a high density of pore and (b) an atomic flat AlN layer grown directly on sapphire substrates.

Recently, there has been an increasing demand for deep ultraviolet (UV) emitters at wavelengths down to 250 nm for many applications such as in bio-agent detection, biomedical system, short range non-line-of-sight communication, water purification and food sterilization. For fabrication of such short wavelength emitters, it is crucial to achieve a high quality AlN buffer layer as an underlying layer for the subsequent growth of any Al-rich 111-V nitrides W emitters. However, it is extremely difficult to grow an AlN layer with high crystal quality on sapphire, Sic and silicon, currently the main substrates for growth of III-Nitride devices. Based on previous experience obtained from GaN growth, lateral epitaxial overgrowth (LEO) has proven an efficient way for significant reduction of dislocation in GaN films. Several other technologies evolved from LEO, such as pendeo-epitaxial, cantilever epitaxy, and facet controlled LEO, have also been developed. These approaches involve in-situ patterning processes. Nevertheless, a tremendous reduction of dislocation density in GaN films has been successfully achieved. Other technologies, involved in in-situ SIN mask, also demonstrated a good approach for reduction of dislocation of GaN films. Lateral overgrowth of AlGaN layer with low Al composition like 20 or 24% by the similar LEO technologies mentioned above or wet chemical etching process involved was reported. However, due to the much larger sticking co-efficient for Al than GaN, AlN can easily nucleate and grow on any mask, such as $SiO_2$ and SiN, currently used in LEO technology. Furthermore, the later growth rate for AlN is very limited due to the current metalorganic chemical vapour deposition (MOCVD) technology, it is therefore extremely difficult to apply the above technologies in growth of AlN films with a low dislocation density. In order to overcome this intrinsic difficulty, a realistic solution has to be developed. A small amount of Ga such as less than 3% added into AlN layer will cause only ~2 nm redshift of bandgap emission if the room-temperature bandgap emission of AlN is at 208 nm. Although this small shift is negligible in terms of device application, it results in significant effect from view of growth because an incorporation of this small amount of Ga leads to enhancement of the lateral growth rate. Recently, maskless LEO growth of $Al_{0.96}Ga_{0.04}$ layer without full coalescence on sapphire was reported, which is heavily involved in-situ patterning process. More recently, a LEO growth of $Al_{0.93}Ga_{0.07}$ layer on deep grooved SiC substrate with significant reduction of dislocation was demonstrated. The in-situ pattering process is still requested, and the much more expensive SiC substrate in comparison with sapphire causes strong internal absorption issue, leading to degraded extraction quantum efficiency of any deep LTV-LEDs if the SiC is not removed. Both make this technology less competitive. Furthermore, it is difficult to apply this approach in sapphire substrate because a deep grooved sapphire, transparent substrate to any deep LTV emission, is extremely hard to achieve.

Therefore, it is a great challenge to achieve a low dislocation density of high Al composition (~98%) AlGaN layer without involvement of in-situ pattering process on sapphire substrate. In this technology, a high quality of $Al_{0.98}Ga_{0.02}N$ layer with significant reduction of dislocation on sapphire was achieved by introducing a self-organized porous AlN layer underneath. The characteristic was made by means of transmission electron microscopy (TEM), atomic force miscopy (AFM) and x-ray diffraction (XRD). This approach avoids both overgrowth and in-situ pattering process, basically solving the problems as mentioned above.

A technique that can be used in this approach is to achieve a high density of self-organized pore in AlN film with certain features. A 450 nm AlN layer with a high density of pore was directly grown on sapphire substrate at 1150° C. under a V/III ratio of ~60 after the substrate was subjected to thermal cleaning in flowing H2. The AFM image of the porous AlN layer was shown in FIG. 1, part (a), in which a high density of pore located in dark areas can be seen clearly. An important feature should be pointed out. Although the column-like islands do not coalesce, the top of each island is very flat. Further decreasing temperature and increasing VIII ratio can increase the area of pore, making the subsequent growth of $Al_{0.98}Ga_{0.02}N$ difficult due to a low lateral growth rate of $Al_{0.98}Ga_{0.02}N$. When the temperature was below 900° C., the AlN layer just consists of a high density of small islands, similar to low temperature AlN nucleation layer. In this case, the pores cannot be formed. For comparison, an atomic flat AlN layer with a thickness of 800 rim was also directly grown on sapphire substrate at 1200° C. under a low VIII ratio of ~40 after the substrate was thermally cleaned in $H_2$ as usual. The AFM image was shown in FIG. 1 part (b), in which long and parallel atomic without step terminations can be clearly seem, the typical feature of AlN epitaxial layer grown on sapphire substrate. The root-mean-square (RMS) roughness is approximately 0.2 mm, corresponding to the 0.2 nm thickness of AlN monolayer.

Once the porous AlN layer with ~500 nm thickness under the best growth was grown, the growth temperature was set to carry on growth of AlN layer with flowing a small amount of Ga precursor (TMGa) under a certain V/III ratio. The small TMGa flow was added in order to result in the enhancement of lateral growth rate. However, we did not systemically investigate this effect. In any case, if increasing TMGa flow rate, the lateral growth rate increases, but the Al composition also increases consequently. Therefore, the increase of TMGa flow rate is limited by the target to achieve wavelength as short as possible.

Figure 2:
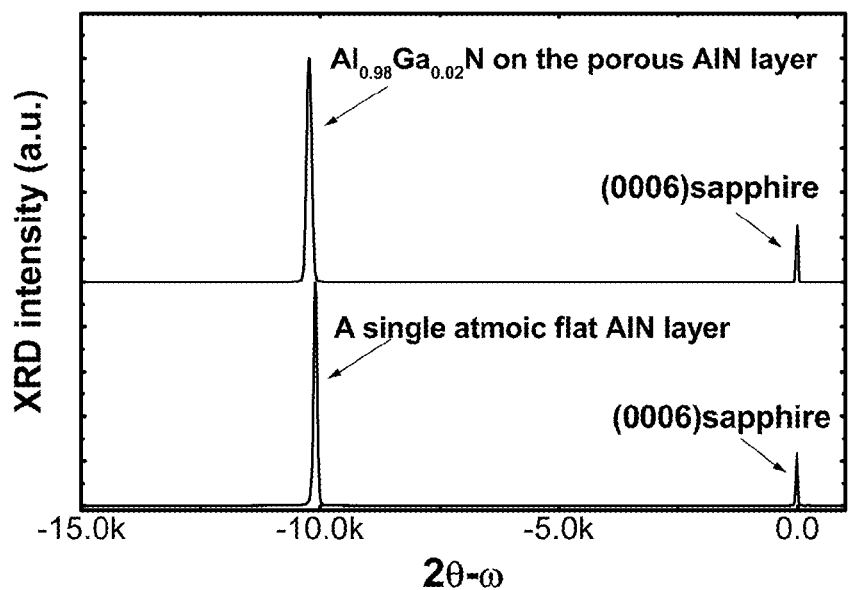
FIG. 2 depicts (0002) $\omega$-2$\theta$ XRD scan for the sample grown on the porous AlN layer and a single atomic flat AlN layer for comparison. (0006) x-ray diffraction peak from sapphire is also included as reference.

In order to examine the Al composition of the layer grown on the porous AlN, (0002) ω-2θ XRD scan was made, shown in FIG. 2. As a reference, the typical (0006) sapphire XRD peak was included. For comparison, the single atomic flat pure AlN layer was also measured and show in FIG. 2. Both XRD peaks from this single atomic flat pure AlN layer and the layer grown on the porous AlN are very close, implying the Al composition is close to 100%. ~98% Al composition was confirmed using the (0006) sapphire XRD peak as a reference point.

Figure 3:
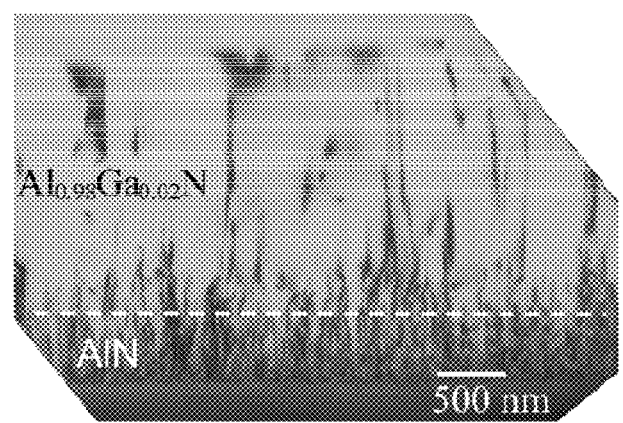
FIG. 3(a) depicts cross-sectional TEM images of the sample grown on the porous AlN layer and FIG. 3(b) depicts a sample grown on an atomic flat AlN layer, with both images taken near the zone axis <1-100> with g=[11-22].
Figure 3:
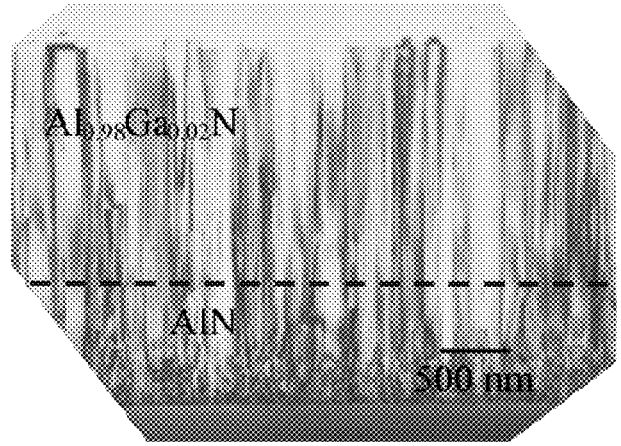

FIG. 3 part (a) shows cross-sectional bright-field images of the $Al_{0.98}Ga_{0.02}N$ layers grown on the porous AlN layer to examine the change of dislocation density. The TEM image was taken near the zone axis <1-100> with g=[11-22], from which all kinds of dislocations including screw, edge and mixed components can be revealed so that the dislocation density can be easily examined. In FIG. 3 part (a), there are clear two regions with significantly different dislocation density along growth direction. In the region of ~500 nm from sapphire, corresponding to the porous AlN layer, the high density of dislocation up to $10^{10}/cm^2$ was observed, similar to the other report of AlN layer directly grown on sapphire substrates. In contrast with it, the dislocation density was remarkably reduced in the $Al_{0.98}Ga_{0.02}N$ layer.

For comparison, the $Al_{0.98}Ga_{0.02}N$ layer on an atomic flat AlN layer under identical conditions was also grown. FIG. 3 part (b) shows the cross-section image of this sample taken near the zone axis <1-100> with g=[11-22]. In a remarkable contrast with FIG. 3 part (a), FIG. 3 part (b) does not show any change in dislocation density from the $Al_{0.98}Ga_{0.02}N$ layer to the atomic flat AlN layer underneath, meaning that no dislocation reduction was clearly observed.

Further evidence to support the high quality of the $Al_{0.98}Ga_{0.02}N$ layer grown on the porous AlN layer includes asymmetric XRD study. Generally, the symmetric XRD of AlN layer on sapphire substrate, i.e, (0002) rocking curve, shows a very narrow FWHM, typically ~100 arc sec, while the asymmetric XRD, namely, (11-20) rocking curve, shows a very wide FWHM, typically ~$0.3°$.[19-22] The reason is that the dislocation of AlN layer on sapphire is dominated by pure-edge component, which cannot be reflected by symmetric XRD rocking curve. Therefore, only the FWHM of asymmetric XRD rocking curve can indicate the change of overall dislocations. In our sample, our data shows that the FWHM of (11-20) rocking curve of our sample grown on the porous AlN layer was decreased by a factor of ~2, indicating the remarkably improved crystal quality once again. Because the XRD peaks of the $Al_{0.98}Ga_{0.02}N$ layer and the porous AlN buffer layer underneath are very close and difficult to separate, the contribution to the FWHM of (11-20) rocking curve should be from both of the $Al_{0.98}Ga_{0.02}N$ and porous AlN layer. However, the contribution to the reduction of the FWHM of (11-20) rocking curve is only from the $Al_{0.98}Ga_{0.02}N$ layer. Therefore, the real FWHM of (11-20) rocking curve from the $Al_{0.98}Ga_{0.02}N$ layer itself should be narrower.

In summary, I demonstrated air-bridged lateral growth of $A_{0.98}Ga_{0.02}N$ layer for dislocation reduction without using in-situ patterning processes. A self-organized porous AlN layer was used as buffer underneath, and the $Al_{0.98}Ga_{0.02}N$ layer was subsequently grown on it. Significant dislocation reduction was confirmed in the $Al_{0.98}Ga_{0.02}N$ layer by means of TEM measurements. In a remarkable contrast with it, the layer on the atomic flat AlN layer grown under identical conditions did not show clear dislocation reduction. Asymmetric X-ray diffraction studies also strongly indicated significantly improved crystal quality using the porous AlN buffer layer. This approach allows us to grow a high crystal quality of high Al composition AlGaN layer using a single step procedure, which is very competitive compared with other technology.

While the present invention has been described and illustrated in conjunction with a number of specific embodiments, those skilled in the art will appreciate that variations and modifications may be made without departing from the principles of the inventions as herein illustrated, described and claimed. The present invention may be embodied in other specific forms without departing from their spirit or characteristics. The described embodiments are to be considered in all respects as only illustrative, and not restrictive. The scope of the invention is, therefore, indicated by the appended claims, rather than the foregoing description. All changes that come within the meaning and range of equivalency of the claims are to be embraced within their scope.

The invention claimed is:

1. A method for reduction of dislocation density in an AlGaN semiconductor comprising the steps of:
 preparing a sapphire substrate for epitaxial layer growth,
 growing a self-organized porous AlN buffer layer on said substrate,
  the AlN layer exhibiting non-coalescing column-like islands with flat tops, and growing an AlGaN layer directly on said AlN layer,
 wherein there are neither any intermediate layers between the substrate and the AlN layer nor any intermediate layers between the AlN and the AlGaN layer.

2. A method as recited in claim 1 wherein in-situ pattering processes on said substrate are not implemented.

3. A method as recited in claim 1 wherein said AlGaN layer contains up to 7% Ga.

4. A method as recited in claim 1 wherein said AlN layer is formed at least in part by use of transmission electron microscopy.

5. A method as recited in claim 1 wherein said AlN layer is formed at least in part by use of atomic force microscopy.

6. A method as recited in claim 1 wherein said AlN layer is formed at least in part by use of x-ray diffraction.

7. A method as recited in claim 1 wherein said AlN layer is formed by use of a combination of atomic force microscopy, x-ray diffraction and transmission electron microscopy in order to achieve an AlN layer that lacks both overgrowth and an in-situ pattering process.

8. A method as recited in claim 7 wherein all the layers are grown at a temperature over 900° C.

* * * * *